United States Patent
Hacksteiner

(10) Patent No.: US 9,506,164 B2
(45) Date of Patent: Nov. 29, 2016

(54) DEVICE AND METHOD FOR METALIZING WAFERS

(76) Inventor: Markus Hacksteiner, Villach (AT)

( * ) Notice: Subject to any disclaimer, the term of this patent is extended or adjusted under 35 U.S.C. 154(b) by 762 days.

(21) Appl. No.: 13/995,051

(22) PCT Filed: Dec. 12, 2011

(86) PCT No.: PCT/AT2011/000492
§ 371 (c)(1),
(2), (4) Date: Jul. 19, 2013

(87) PCT Pub. No.: WO2012/079101
PCT Pub. Date: Jun. 21, 2012

(65) Prior Publication Data
US 2013/0284602 A1    Oct. 31, 2013

(30) Foreign Application Priority Data

Dec. 15, 2010  (AT) .................. A 2075/2010

(51) Int. Cl.
| | |
|---|---|
| C25D 17/06 | (2006.01) |
| C25D 5/00 | (2006.01) |
| C25D 5/08 | (2006.01) |
| C25D 17/00 | (2006.01) |
| C25D 17/08 | (2006.01) |
| C25D 17/12 | (2006.01) |
| H01L 21/288 | (2006.01) |
| H01L 21/67 | (2006.01) |
| C25D 7/12 | (2006.01) |

(52) U.S. Cl.
CPC ............. *C25D 17/06* (2013.01); *C25D 5/003* (2013.01); *C25D 5/08* (2013.01); *C25D 7/123* (2013.01); *C25D 17/001* (2013.01); *C25D 17/004* (2013.01); *C25D 17/08* (2013.01); *C25D 17/12* (2013.01); *H01L 21/2885* (2013.01); *H01L 21/6715* (2013.01); *H01L 21/67023* (2013.01)

(58) Field of Classification Search
CPC ..... C25D 7/123; C25D 17/08; C25D 17/001
See application file for complete search history.

(56) References Cited

U.S. PATENT DOCUMENTS

| | | | |
|---|---|---|---|
| 5,024,746 A * | 6/1991 | Stierman ............ | C25D 7/12 204/287 |
| 6,022,465 A * | 2/2000 | Ting ................ | C25D 7/12 205/118 |
| 6,558,518 B1 | 5/2003 | Sendai et al. | |
| 2004/0055890 A1 | 3/2004 | Mizohata | |
| 2007/0080057 A1 | 4/2007 | Mizohata et al. | |
| 2007/0289873 A1 | 12/2007 | Uchiumi | |

FOREIGN PATENT DOCUMENTS

| | | |
|---|---|---|
| EP | 1067221 A2 | 1/2001 |
| EP | 1441048 A2 | 7/2004 |
| JP | 6275598 | 9/1994 |

(Continued)

*Primary Examiner* — Bryan D. Ripa
(74) *Attorney, Agent, or Firm* — Laurence A. Greenberg; Werner H. Stemer; Ralph E. Locher

(57) ABSTRACT

A device for metalizing wafers, in particular microchip wafers, in an electrolyte, contains a plurality of holder arrangements. Each holder arrangement has a chamber for the electrolyte which is separate from the electrolyte-receiving chambers in other holder devices, a ring acting as cathode, and an anode system as the anode being associated with each wafer.

38 Claims, 8 Drawing Sheets

(56) References Cited

FOREIGN PATENT DOCUMENTS

| JP | 6291109 | 10/1994 |
| JP | 7243098 | 9/1995 |
| JP | 07243098 A * | 9/1995 |

* cited by examiner

DEVICE AND METHOD FOR METALIZING WAFERS

BACKGROUND OF THE INVENTION

Field of the Invention

The invention relates to a device for metalizing wafers having the features of the introductory part of claim 1. The invention also relates to methods for metalizing wafers.

In the prior art, the electrolytic metalization of wafers, in particular microchip wafers (e.g. with copper), is known. The known metalization is carried out in the individual wafer mode, which means that a single wafer is processed, i.e. metalized, for each method and process chamber. The wafer to be metalized (e.g. a microchip wafer) is usually dipped into an electrolyte with its front side at the bottom. During the process (metalization), electrolyte is set flowing continuously in a laminar fashion and parallel to the wafer surface. In order to establish and maintain this state of flow, increased attention is required and complicated devices are necessary.

One disadvantage of the known procedure is that, because of long process times (many minutes to hours), the metalization is very expensive, since only one wafer respectively can be run in each process and process chamber. The larger the structures on the surface of the microchip wafer which have to be filled with metal, the longer the process times.

In view of the fact that it is to be expected that microchips will increasingly be integrated vertically (a plurality of microchip layers one above another, in which contact with one another has to be made), the filling of wide and deep channels (what are known as through silicon vias) which, in the finished microchip, are used as vertical conductor tracks, with an electrically conductive metal, for example copper, is required. These channels can have widths of some micrometers and depths of up to 100 micrometers and more.

BRIEF SUMMARY OF THE INVENTION

The invention is based on the object of providing a device of the generic type mentioned at the beginning with which the metalization of wafers, in particular microchip wafers, in batch operation is possible with good success.

This object is achieved by a device which has the features according to the independent claim.

Preferred and advantageous refinements of the devices according to the invention are the subject matter of the sub-claims.

One advantage of the device according to the invention is the small space required per wafer, in particular microchip wafer, to be metalized. For example, only little electrolyte is required for each wafer, which is the case in particular when, with the device according to the invention, a sealed electrolyte volume is present for each wafer.

The device according to the invention, which has at least one but preferably a plurality of holding arrangements for the simultaneous metalization of a plurality of wafers (microchip wafers), can be dipped into an electrolysis bath with the wafer front side pointing upward as an "open batch", that is to say with an open electrolyte chamber, and after that it is at least partly moved together (in order to save space), or else the holding arrangements are closed entirely ("closed batch").

In the case of the device according to the invention, it is also possible to close the holding arrangements for the individual wafers from the start and to fill each of the chambers provided for electrolyte in the holding arrangements with electrolyte via feed lines and discharge lines.

If the device according to the invention is used as a "closed batch", the chamber which is available for the electrolyte for each wafer is defined by the wafer, the frame and the upper closure plate, which is possibly a base plate of a further holding arrangement.

Within the context of the invention, provision can be made for the device according to the invention to be set vibrating with the aid of an eccentric, so that the result is a vibrating body of electrolyte. The frequency can be set fixedly or selectively variably or randomly variably.

If the device according to the invention is dipped into an electrolysis bath with the wafer front side pointing upward, it is preferred for the individual holding arrangements not yet to be pushed together, in order that the electrolyte can flow out of the bath between the holding arrangements and gas can escape. As soon as the device according to the invention is positioned in the electrolyte, the holding arrangements for the wafers can be pushed together, partly or wholly, if a "closed batch" is used.

If, in the case of the device according to the invention, work is carried out with "closed batch", the result is enrichment of metal ions during the metalization process, on account of the closed body of electrolyte. This can be compensated for by appropriate process control.

The device according to the invention permits process management which makes electrolytic metalization of large microchip structures in batch operation possible with minimal space required. In this way, costs can be saved.

Further details and features of the invention can be gathered from the following description of a preferred exemplary embodiment.

DESCRIPTION OF THE INVENTION

Figure 1:
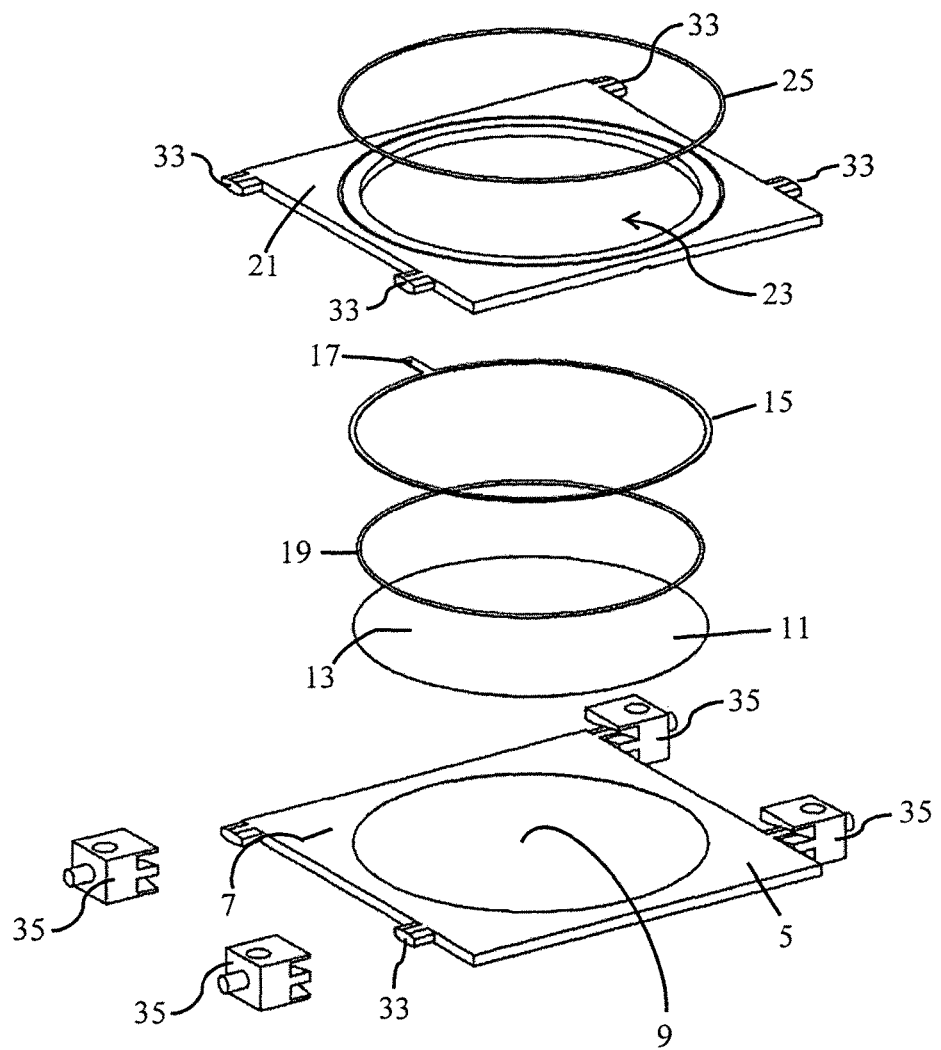
FIG. 1 shows an exploded illustration of a holding arrangement of a device according to the invention, FIG. 2 a part of the holding arrangement in section, FIG. 3 a holding arrangement (without upper closure plate) in oblique view, FIG. 4 a base plate with anode network, seen from below, FIG. 5 a clamping element in oblique view, FIG. 6 a device according to the invention having a plurality of holding arrangements "opened", FIG. 7 the device from FIG. 6 with closed holding arrangements.

A device 1 according to the invention has one or more holding arrangements 3, four in the exemplary embodiment shown in the drawings.

Figure 2:
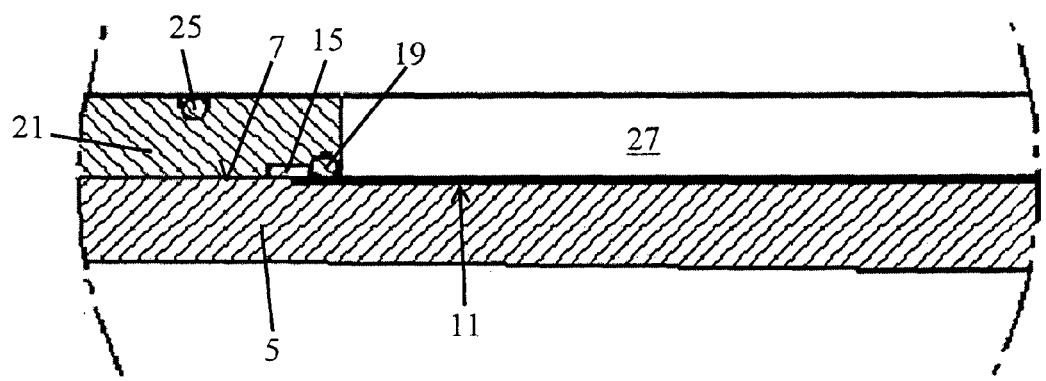

Each of the holding arrangements 3, as shown in particular by FIGS. 1 and 2, has the following parts:

A base plate 5 made of electrically insulating material, on the upper side 7 of which a circular depression 9 (recess) is provided, into which a wafer 11 to be treated, in particular a microchip wafer, can be inserted, the front side 13 of which, i.e. the side on which are located the channels which are to be filled with metal, for example copper, by electrolytic metalization in an electrolyte, points upward.

Placed on the edge region of the wafer 11 is a ring 15 of electrically conductive material serving as cathode, which can be connected to a voltage source via a tag 17, in order to polarize the wafer 11 as cathode. Within the ring 15 which serves as cathode, in order to connect the wafer 11 with the negative terminal of a voltage source with the effect of polarizing as cathode, an annular seal 19, in particular an O-ring, is inserted.

Above the described arrangement comprising base plate 5, wafer 11, ring 15 (cathode) and sealing ring 19, there is placed a frame 21 made of electrically insulating material, in which a recess 23, which delimits the chamber 27 for electrolyte laterally, is provided. The frame 21 has, for example, a height of no more than 20 mm.

On the frame 21 of insulating material with its recess 23, an annular seal 25, for example an O-ring, is placed around the recess 23. The seal 25 can also be received in an annular groove in the frame 21 (cf. FIG. 2).

In order to complete the holding arrangement 3, an upper closure plate, which is possibly a base plate 5 of a further holding arrangement 3, is placed on the seal 25 on the frame 21.

As FIG. 2 shows, the chamber 27, which is filled with electrolyte for the electrolytic metalization of the wafer 11, is defined by the frame 21, by the wafer 11 and by the upper closure plate, which can in particular be the base plates of another holding arrangement 3.

The holding arrangement 3 can (not shown) be assigned a heating/cooling arrangement, in order to keep the holding arrangement 3 at the respectively required temperature (to control the temperature).

Figure 4:
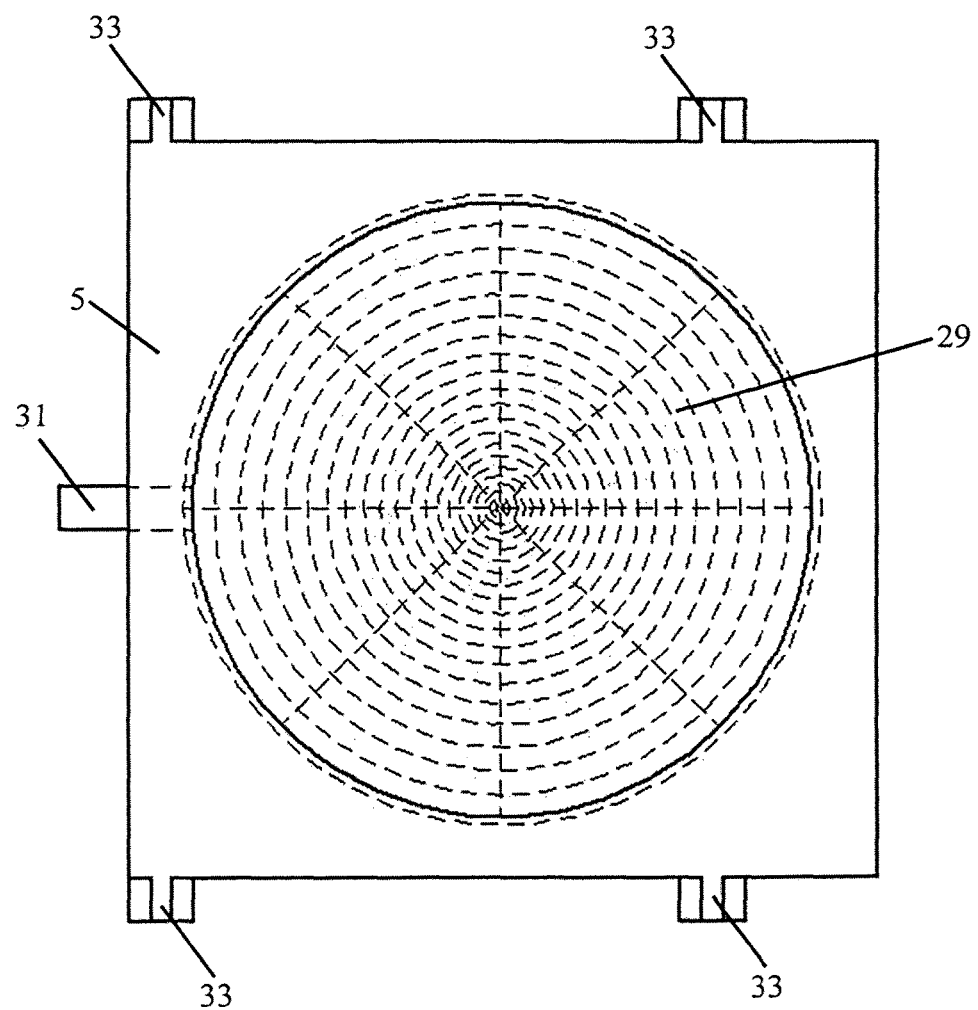

In the exemplary embodiment shown (cf. FIG. 2), provision is made for the upper closure plate, which can be the base plate 5 of a further holding arrangement 3, to carry on its underside an anode network 29 (cf. FIG. 4), which is equipped with a tag 31 in order to be able to connect the anode network 29 on the underside of the closure plate (base plate 5) to the positive terminal of a voltage source.

In order to compensate for the voltage drop from the outer edge of the wafer 11 to the middle of the wafer 11, the underside of the base plate 5 having the anode network 29 can be convex. Additionally or alternatively, the density of the conductors forming the anode network 29 can increase toward the center of the anode network 29. The anode network 29 is thus woven more densely toward the middle.

Figure 6:
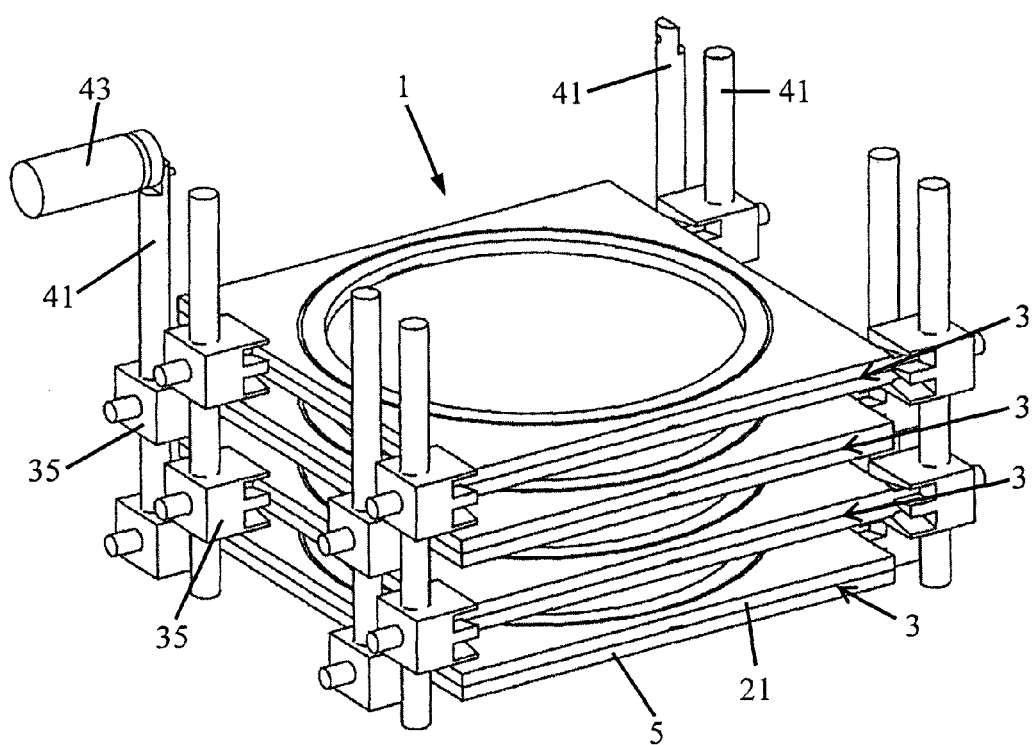
Figure 7:
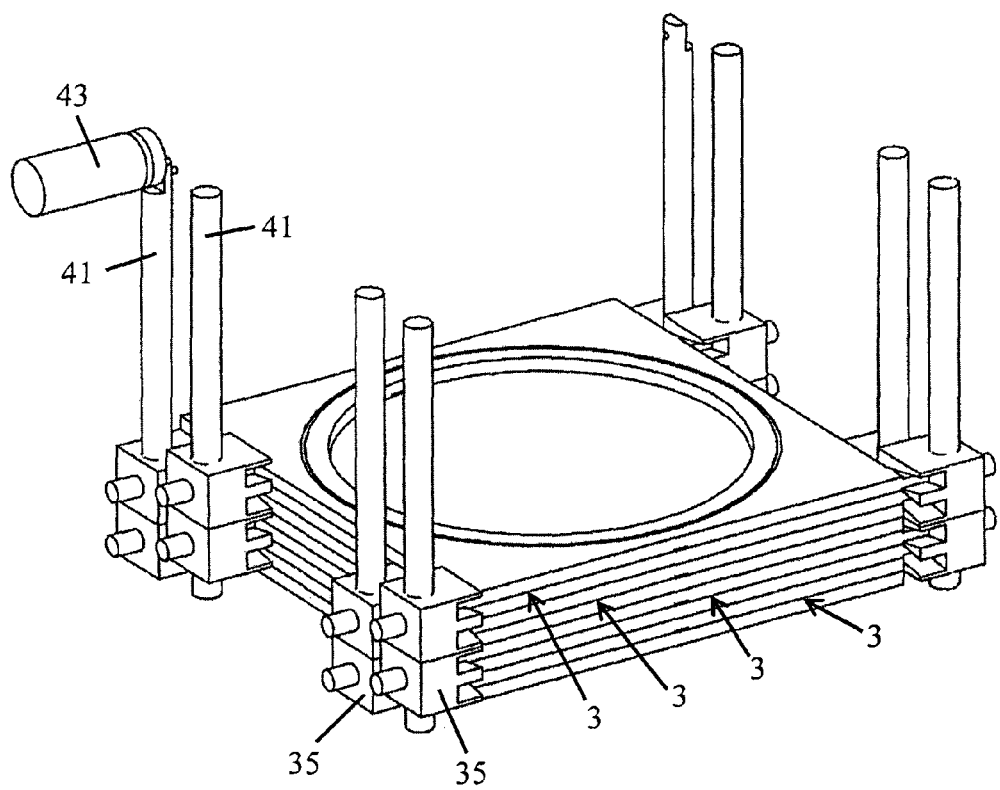

In the exemplary embodiment shown, consideration has been given to providing a plurality of holding arrangements 3 one above another in the device 1 according to the invention. It is therefore preferred for the upper closure plate of holding arrangements 3 to be formed by the base plate 5 (with anode network 29) of the next upper holding arrangement 3, as is the case in the exemplary embodiment shown in the drawings (FIGS. 6 and 7).

In order to press the base plate 5 ("anode plate") and the frame 21 ("cathode frame"), which both consist of insulating material, against each other in order to connect them to each other in a liquid-tight manner, at the lateral edges of the base plate 5 and of the frame 21 there are provided projections 33 (tongues) projecting outward, which taper in a wedge shape toward both sides and to which clamping elements 35 are assigned. The clamping elements 35 have, on their side facing the base plate 5 and the frame 21, a groove 37, which forks in the shape of a Y into two branches 39 (cf. FIG. 5).

Figure 3:
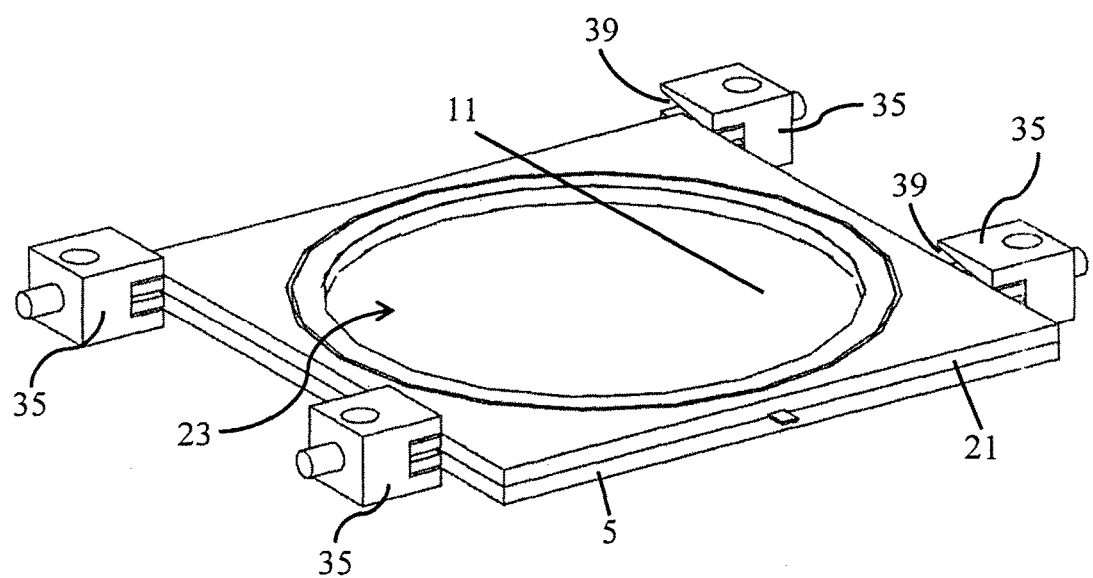

In the open position, the tongues 33 of the base plate 5 and frame 21 are provided in the branches 39 of the groove 37, so that the base plate 5 is spaced apart from the frame 21. By means of displacing the clamping elements 35 in a plane parallel to the plane of the base plate 5 and the frame 21, the aforementioned constituent parts (base plate 5 and frame 21) of the holding arrangement 3 according to the invention can be pressed against each other. This position of use of base plate 5 and frame 21 of the holding arrangement 3 is shown in FIG. 2 and FIG. 3. The devices with which the clamping elements 35 are displaced along the guide rods 41, i.e. brought closer to each other, in order to move the individual holding arrangements 3 together, are not illustrated.

Figure 5:
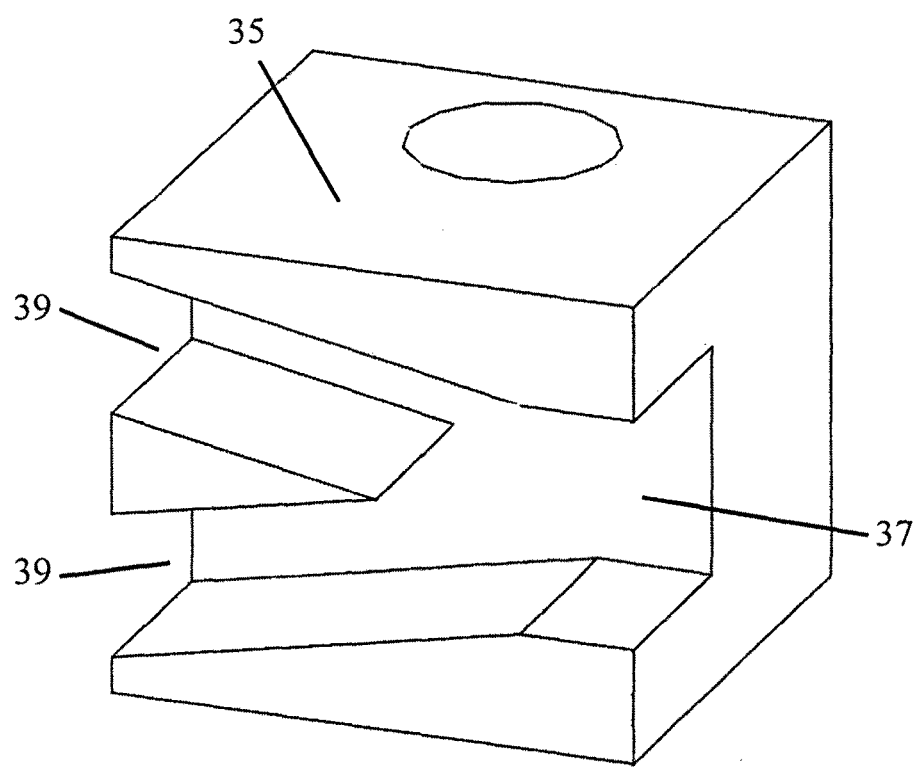

FIG. 5 shows a clamping element 35 on an enlarged scale, and the groove 37 which divides in the shape of a Y into two branches 39.

In FIG. 6, a device 1 according to the invention having a plurality of holding arrangements 3 is shown in the opened state ("open batch"), but without any "upper" closure plate on the uppermost holding arrangement 3. The clamping elements 35 are guided such that they can be displaced on guide rods 41 oriented at right angles to the plane of the holding arrangements 3, wherein the guide rods 41 can be displaced transversely with respect to their longitudinal extent, i.e. in a direction parallel to the plane of the holding arrangements 3, by actuating means, not shown, in order to open or to close the respective holding arrangements 3 via the clamping elements 35.

In each holding arrangement 3, between base plate 5 and frame 21, a wafer 11 (microchip wafer) to be treated (metalized) is inserted, for example with the aid of a handling device (gripper) that is usual for wafers 11, in such a way that said wafer comes to lie with its front side up in the holder 9 in the lower base plate 5 (anode plate). In principle, it is possible to carry out the metalization if the device 1 assumes a position ("open batch") according to FIG. 6, wherein a common electrolyte for the treatment of all the wafers 11 provided in the individual holding arrangements 3 is provided.

FIGS. 6 and 7 also show that the tongues 33 and the clamping elements 35 of successive (adjacent) holding arrangements 3 are arranged offset with respect to one another, in order that the holding arrangements 3 can be displaced out of the mutually spaced position (open batch) shown in FIG. 6 into the position resting on one another (closed batch) shown in FIG. 7, without the clamping elements 35 hindering or preventing this movement.

Within the context of the invention, provision is advantageously made for the holding arrangements 3 of the device 1 according to the invention, as shown in FIG. 7, to be brought closer to one another by displacing the clamping elements 35 along the guide rods 41, so that the frame 21 of each holding arrangement 3 comes into contact with the base plate 5 of the next upper holding arrangement 3 (sealed off by the sealing ring 25). Thus, the base plate 5 of the respective upper holding arrangement 3 simultaneously forms the closure plate of the next lower holding arrangement 3 ("closed batch"). In this case, in each holding arrangement 3, the chamber 27 shown in FIG. 2, which is filled with electrolyte, is closed off, so that a predetermined volume of electrolyte is available for the metalization of a microchip wafer 11 by means of electrolysis. The chambers 27 of the holding arrangements 3, which chambers are provided to receive electrolyte, can be filled with/emptied of electrolyte independently of one another via feed lines and the discharge lines. This results in the advantages outlined in the introduction to the description. The devices with which a plurality of holding arrangements 3 arranged above one another can be pressed against each other by displacing the clamping elements 35 along the guide rods 41 (position according to FIG. 7) are not illustrated.

In order to assist the electrolysis and therefore the metalization of the wafers, in particular when use is made of the device 1 according to the invention with holding arrangements 3 according to FIG. 7 placed closely against one another ("closed batch"), the device 1 as a whole can be set vibrating while the electrolysis is carried out. To this end, in the exemplary embodiment shown (FIGS. 6 and 7), a motor 43 with eccentric is connected to at least one of the guide rods 41, so that a vibrating body of electrolyte results. The frequency can be set fixedly or selectively variably or randomly variably.

Figure 8:
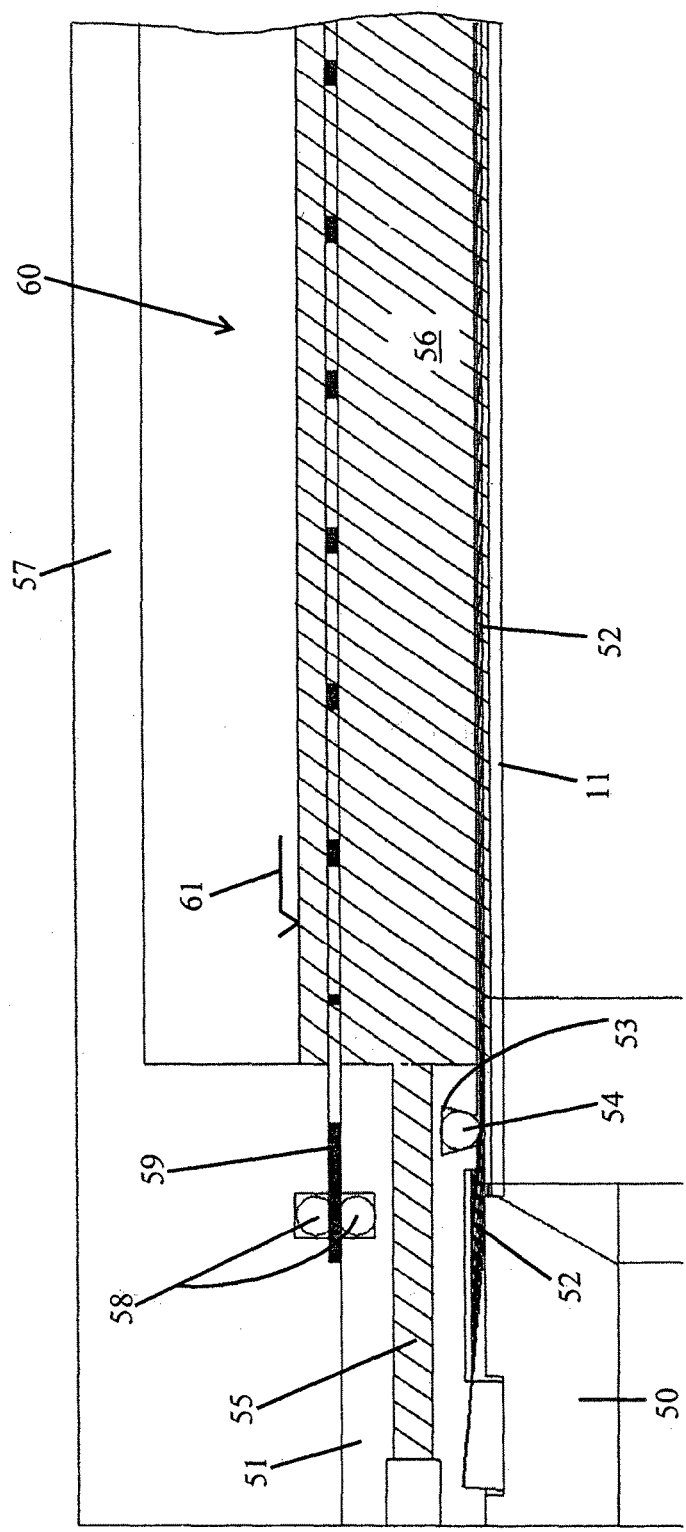
FIG. 8 is a sectional view of the gas chamber above the wafer.

In the embodiment shown in FIG. 8, an individual module, comprising covering and base part, is provided for each wafer. In the embodiment shown in FIG. 8, the covering is not at the same time the wafer holder located above. Thus, the embodiment shown in FIG. 8 constitutes individual reactor modules which are arranged one above another in sequence, so that a batch mode of operation is possible.

In detail, the embodiment shown in FIG. 8 is built up as follows:

On a base part 50 there lies a wafer 11, the front side of which points upward. Arranged between the base part 50 and the frame part 51 is a contact 52, which is in electrically conductive contact with the edge of the wafer 11. On the side of the frame part 51 that faces the wafer 11 (pointing downward toward the base part), a seal 54, in particular in the form of an O-ring, is received in an annular groove 53.

In addition, in the frame part 51 there is provided at least one conduit 55, through which electrolyte 56 can be led into the chamber in which the wafer 11 is received, and out of the chamber.

Seated on the frame part 51 is the upper covering 57 (cover plate), a grid-like anode 59, in particular an anode 59 in the form of a perforated plate or grid, being arranged between the cover plate 57 and the frame part 51 and held by annular seals 58 (O-rings).

In the embodiment shown in FIG. 8, in the chamber above the wafer 11, so much electrolyte is put in that the anode 59 is submerged in the electrolyte, that is to say the electrolyte level 61 lies above the anode 59. Above the electrolyte level 61, in the space between base part and covering, a gas chamber 60 is provided, which is filled with an inert gas, for example nitrogen or argon or another gas that is inert under the process conditions.

The devices according to the invention, in particular the device from FIG. 8, permit electrolyte to be pumped around during the process.

In principle, there is the possibility of gassing electrolyte with an inert gas outside the reactor before the filling of the reactor or, if electrolyte is pumped around during the process, even during the process.

As already indicated in conjunction with FIG. 8, the gas chamber above the electrolyte is filled with an inert gas, so that inert gas is present during the process.

The rinsing water which is applied following the ending of the treatment of the wafer 11 can be gassed with an inert gas before it is used.

Following the conclusion of the method, the following process sequence can further be applied:
 drainage of the electrolyte out of the process chamber by means of suction or forcing out by increasing the pressure of the inert gas in the gas chamber,
 drying of the process chamber and of the wafer contained therein with inert gas,
 unloading the wafer following the drying,
 rinsing the wafer with water outside the process chamber,
 final (renewed) drying of the wafer outside the process chamber.

In summary, an exemplary embodiment of the invention can be described as follows:

A device 1 for metalizing wafers 11, in particular microchip wafers, in an electrolyte comprises a plurality of holding arrangements 3, wherein each holding arrangement 3 has a chamber 27 for the electrolyte which is separated from the holding chambers 27 for electrolyte in other holding arrangements 3, and wherein each wafer 11 is assigned a ring 15 serving as cathode and an anode network 29 as anode.

The invention claimed is:

1. A device for electrolytic metallization of wafers, in an electrolyte, the device comprising:
 a plurality of holding apparatuses disposed one above another for holding the wafer to be metalized, each of said holding apparatuses containing:
  a base plate made of an electrically insulating material with a receiving region for the wafer;
  a frame made of insulating material having a recess formed therein and forming a chamber for receiving the electrolyte;
  a ring of an electrically conducting material serving as a cathode;
  a closure plate disposed on a side of said frame facing away from said base plate and covering said chamber for the electrolyte;
  an anode network disposed on a side of said closure plate facing the wafer; and
  holders for holding said base plate and said frame in contact with each other.

2. The device according to claim 1, further comprising a seal disposed between said base plate and said frame.

3. The device according to claim 2, wherein said seal is disposed within said ring serving as the cathode.

4. The device according to claim 2, wherein said seal is an annular seal.

5. The device according to claim 2, wherein said seal is clamped between said frame and said wafer lying on said base plate.

6. The device according to claim 1, wherein said receiving region for the wafer to be metalized is a depression formed in said base plate.

7. The device according to claim 1, wherein said base plate forms said closure plate of said holding apparatus respectively disposed underneath.

8. The device according to claim 1, further comprising wedge-shaped projections pointing outward are disposed on said base plate and on said frame, disposed on said wedge-shaped projections are said holders for pressing said base plate and said frame against one another act.

9. The device according to claim 8, wherein said holders are clamping elements having grooves formed therein in which said wedge-shaped projections on said base plate and on said frame engage.

10. The device according to claim 9, wherein said grooves divide in a Y shape into two branches.

11. The device according to claim 8, further comprising guide rods, said clamping elements are guided such that they can be displaced on said guide rods at right angles to a plane of said base plate and said frame.

12. The device according to claim 9, wherein said clamping elements for moving said base plate and said frame toward each other and away from each other can be displaced parallel to a plane of said frame and said base plate.

13. The device according to claim 1, further comprising apparatuses containing said base plate and said frame and can be displaced from a position in which they are at a distance from each other into a position in which they rest on each other.

14. The device according to claim 13, further comprising seals disposed, between said apparatuses, and further disposed between said frame and said base plate of an apparatus lying above, serving as said closure plate.

15. The device according to claim 1, further comprising at least one vibration generator assigned to said holding apparatuses.

16. The device according to claim 15, wherein said vibration generator is a vibration generator for generating vibrations with a fixed, selectively variable or randomly variable frequency.

17. The device according to claim 1, wherein a temperature of said holding apparatuses can be controlled.

18. The device according to claim 7, wherein, in said plurality of holding apparatuses, said chambers, being closed chambers for the electrolyte, can be filled with the electrolyte and emptied independently of one another.

19. The device according to claim 1, further comprising an anode network being woven increasingly more closely toward a middle.

20. The device according to claim 1, wherein said base plate has a surface facing away from the wafer being curved convexly.

21. The device according to claim 1, further comprising:
an electrolyte chamber; and
a gas chamber disposed above the electrolyte in said electrolyte chamber for holding the electrolyte.

22. The device according to claim 21, wherein said gas chamber is filled with an inert gas.

23. The device according to claim 1, further comprising conduits for leading the electrolyte into a circuit during operation of the device.

24. The device according to claim 23, further comprising at least one pump connected in said conduits for pumping the electrolyte around during the operation of the device.

25. The device according to claim 1, further comprising a further apparatus for gassing the electrolyte during the operation of the device.

26. The device according to claim 1, wherein the wafers include microchip wafers and the electrolytic metallization fills channels in the microchip wafers with metal, including copper.

27. The device according to claim 14, wherein said seals are annular seals.

28. The device according to claim 22, wherein said inert gas is selected from the group consisting of nitrogen and argon.

29. A method for electrolytic metallization of wafers, in an electrolyte, which comprises the steps of:
providing a device for the electrolytic metallization of the wafers and having a plurality of holding apparatuses disposed one above another for holding the wafer to be metalized, the holding apparatuses each containing a base plate made of an electrically insulating material with a receiving region for the wafer, a frame made of insulating material having a recess formed therein and forming a chamber for receiving the electrolyte, a ring of an electrically conducting material serving as a cathode, a closure plate disposed on a side of the frame facing away from the base plate and covering the chamber for the electrolyte, an anode network disposed on a side of the closure plate facing the wafer, and holders for holding the base plate and the frame in contact with each other; and
gassing the electrolyte with an inert gas before the metallization is carried out.

30. The method according to claim 29, which further comprises gassing the electrolyte outside the device.

31. The method according to claim 30, which further comprises pumping the electrolyte around during the metallization and is gassed outside the device.

32. A method for electrolytic metallization of wafers, in an electrolyte, which comprises the steps of:
providing a device for the electrolytic metallization of the wafers and having a plurality of holding apparatuses disposed one above another for holding the wafer to be metalized, the holding apparatuses each containing a base plate made of an electrically insulating material with a receiving region for the wafer, a frame made of insulating material having a recess formed therein and forming a chamber for receiving the electrolyte, a ring of an electrically conducting material serving as a cathode, a closure plate disposed on a side of the frame facing away from the base plate and covering the chamber for the electrolyte, an anode network disposed on a side of the closure plate facing the wafer, and holders for holding the base plate and the frame in contact with each other;
performing the electrolytic metallization of the wafer; and
gassing rinsing water before rinsing of the wafer following a conclusion of the metallization.

33. A method for the electrolytic metallization of wafers, in an electrolyte, which comprises the steps of:
providing a device for the electrolytic metallization of the wafers and having a plurality of holding apparatuses disposed one above another for holding the wafer to be metalized, the holding apparatuses each containing a base plate made of an electrically insulating material with a receiving region for the wafer, a frame made of insulating material having a recess formed therein and forming a chamber for receiving the electrolyte, a ring of an electrically conducting material serving as a cathode, a closure plate disposed on a side of the frame facing away from the base plate and covering the chamber for the electrolyte, an anode network disposed on a side of the closure plate facing the wafer, and holders for holding the base plate and the frame in contact with each other;
removing the electrolyte from the chamber holding the electrolyte; and
drying the wafer before an unloading of the wafer.

34. The method according to claim 33, which further comprises drying the device without rinsing the device.

35. The method according to claim 33, which further comprises rinsing and drying the wafer outside the device.

36. The method according to claim 35, which further comprises:
unloading the wafer from the device following a drying of the device;
rinsing the wafer with rinsing water; and
subsequently drying the wafer using an inert gas.

37. The method according to claim 36, which further comprises gassing the rinsing water before the rinsing of the wafer.

38. The method as claimed in claim 35, which further comprises using an inert gas for drying the wafer.

* * * * *